United States Patent
La Rosa et al.

(10) Patent No.: US 9,997,213 B2
(45) Date of Patent: *Jun. 12, 2018

(54) SENSE AMPLIFIER

(71) Applicants: STMicroelectronics S.r.l., Agrate Brianza (IT); STMicroelectronics (Rousset) SAS, Rousset (FR)

(72) Inventors: Francesco La Rosa, Rousset (FR); Gineuve Alieri, Trapani (IT)

(73) Assignees: STMicroelectronics (Rousset) SAS, Rousset (FR); STMicroelectronics S.r.l., Agrate Brianza (IT)

(*) Notice: Subject to any disclaimer, the term of this patent is extended or adjusted under 35 U.S.C. 154(b) by 0 days. days.

This patent is subject to a terminal disclaimer.

(21) Appl. No.: 15/657,408

(22) Filed: Jul. 24, 2017

(65) Prior Publication Data
US 2017/0323670 A1 Nov. 9, 2017

Related U.S. Application Data

(63) Continuation of application No. 15/363,270, filed on Nov. 29, 2016, now Pat. No. 9,792,962.

(51) Int. Cl.
G11C 7/00 (2006.01)
G11C 7/06 (2006.01)
G11C 8/10 (2006.01)
G11C 5/14 (2006.01)

(52) U.S. Cl.
CPC ............... G11C 7/065 (2013.01); G11C 5/14 (2013.01); G11C 8/10 (2013.01)

(58) Field of Classification Search
CPC ...................................... G11C 7/065
USPC ................................. 365/205, 206
See application file for complete search history.

(56) References Cited

U.S. PATENT DOCUMENTS

| 6,836,426 | B1 | 12/2004 | Fukushi et al. |
| 9,792,962 | B1* | 10/2017 | La Rosa ................ G11C 7/065 |
| 2003/0107932 | A1 | 6/2003 | Komura |
| 2014/0192603 | A1 | 7/2014 | Singh |

FOREIGN PATENT DOCUMENTS

JP 3483634 B2 1/2004

* cited by examiner

*Primary Examiner* — Hoai V Ho
(74) *Attorney, Agent, or Firm* — Slater Matsil, LLP

(57) ABSTRACT

A read-amplifier circuit includes a core with a first input and a second input that are intended to receive in a measurement phase a differential signal arising from a first bit line and from a second bit line of the memory device. The circuit also includes a memory element with two inverters coupled in a crossed manner. The first and second inputs are respectively connected to two of the power supply nodes of the inverters via two transfer capacitors. A first controllable circuit is configured to temporarily render the memory element floating during an initial phase preceding the measurement phase and during the measurement phase.

21 Claims, 7 Drawing Sheets

SENSE AMPLIFIER

CROSS-REFERENCE TO RELATED APPLICATIONS

This application is a continuation of U.S. patent application Ser. No. 15/363,270, filed on Nov. 29, 2016, which claims benefit of French Patent Application No. 1653396, filed on Apr. 18, 2016, which applications are hereby incorporated herein by reference.

TECHNICAL FIELD

Modes of implementation and embodiments of the invention relate to memory circuits, and, in particular embodiments, to a sense amplifier for a memory device.

BACKGROUND

Numerous electronic devices are widely used today, such as for example laptop computers, smartphones and tablets. Such electronic devices generally contain a microprocessor, volatile memory used by the microprocessor during the execution of software applications, and non-volatile memory for storing applications and data over the long term.

Read-amplifier circuits are used in a conventional manner in these volatile or non-volatile memory devices during the operations of reading the data in the memory cells of these devices.

Among the known read-amplifier circuit architectures, used in particular in non-volatile memories, may be cited the architecture comprising a memory element of the latch-memory type based on two inverters coupled in a crossed manner and intended to be connected between a pair of bit lines of the memory device.

More precisely, each inverter has its input connected to one bit line and its output connected to the other bit line.

Such a read-amplifier circuit provides fast signal amplification. However, in practice, it is difficult to produce a pair of inverters comprising perfectly matched transistors.

However, mismatches in the characteristics of the transistors can produce an offset voltage at the outputs of the inverters during a reset phase. Indeed, this offset is reflected at the inputs of the inverters.

However, in a particularly unfavorable case, this offset reflected at the level of the inputs of the inverters may be detected as a signal representative of a binary data item and consequently cause a reading error. Indeed, these data errors when reading are highly undesirable since they can negatively affect the performance of the electronic device.

SUMMARY

Modes of implementation and embodiments of the invention relate to memory circuits, and, in particular embodiments, to a sense amplifier for a memory device.

Particular embodiments relate to read-amplifier circuits capable of compensating for a voltage offset. For example, a read amplifier of embodiments is less sensitive to voltage offsets while retaining the fast response of read amplifiers with crossed coupled inverters.

Thus, according to a mode of implementation and embodiment, it is in particular proposed to render temporarily floating the memory element with two inverters coupled in a crossed manner of the read-amplifier circuit, prior to the measurement phase and during the measurement phase so as to attain an equilibrium state in which the transistors of the two inverters are all disabled, the voltage offset then being compensated, this equilibrium being broken thereafter in the measurement phase with the memory element kept floating and the signals of the bit lines transferred to two power supply nodes (for example, the sources of the NMOS transistors) of the inverters via capacitors.

A "floating" memory element is in particular a memory element, all of whose power supply nodes are disconnected from the power supply terminals of the circuit.

According to one aspect, there is proposed a method of control of a read-amplifier circuit during an operation of reading a data item stored in a memory device. The circuit comprises a core comprising two power supply terminals and a memory element with two crossed coupled inverters, the reading operation comprising a phase of measurement ("sensing") of a differential signal present at two inputs of the core and arising from two bit lines of the memory device.

According to a general characteristic of this aspect, the method comprises, prior to the measurement phase, an initial phase comprising a disconnection of the power supply nodes of the memory element from the two power supply terminals so as to bring the memory element to an equilibrium state, and, in the measurement phase, a delivery of the differential signal to two of the respective power supply nodes of the two inverters via two so-called transfer capacitors and a breakage of the equilibrium state while keeping the power supply nodes of the memory element disconnected from the two power supply terminals.

According to one mode of implementation, the initial phase comprises, before the disconnection of the power supply nodes of the memory element from the two power supply terminals, a step of charging, via the two power supply terminals, a capacitive network connected to the power supply nodes of the inverters and comprising the two transfer capacitors, and during the disconnection of the power supply nodes of the memory element from the two power supply terminals, a connection of the input nodes to the output nodes of the inverters.

The power supply nodes of the inverters are the sources of the NMOS transistors of these inverters and the sources of the PMOS transistors of these inverters, and in the measurement phase the differential signal is advantageously delivered to the respective sources of the NMOS transistors of the two inverters.

Indeed customarily the differential signal decreases in the measurement phase. This being so, for setups providing for an increase in the differential signal it would be possible to deliver the differential signal to the respective sources of the PMOS transistors of the two inverters.

According to one mode of implementation, the disconnection of the power supply nodes of the memory element from the two power supply terminals prior to the measurement phase comprises a disconnection of the sources of the NMOS transistors from a first power supply terminal intended to receive a low supply voltage, for example ground, and then a disconnection of the sources of the PMOS transistors from the second power supply terminal intended to receive a high supply voltage, for example a supply voltage.

The fact of firstly disconnecting the sources of the NMOS transistors and thereafter disconnecting the sources of the PMOS transistors makes it possible to bring to the equilibrium state the sources of the NMOS transistors at a voltage slightly further away from ground, thereby giving a larger margin of maneuver in the measurement ("sensing") phase.

This being so, it would be entirely possible to firstly disconnect the sources of the PMOS transistors and thereafter to disconnect the sources of the NMOS transistors or else to simultaneously disconnect the sources of the NMOS and PMOS transistors.

According to one mode of implementation, the measurement phase comprises a disconnection of the input nodes from the output nodes of the inverters, thereby making it possible to break the equilibrium attained before the start of this measurement phase.

The reading operation advantageously comprises, subsequent to the measurement phase, a phase of latching the read data item in the memory element, comprising a reconnection of the power supply nodes of the memory element to the two power supply terminals.

According to another aspect, there is proposed a read-amplifier circuit for memory device, comprising a core comprising a first input and a second input which are intended to receive in a measurement phase a differential signal arising from a first bit line and from a second bit line of the memory device, and a memory element with two inverters coupled in a crossed manner.

According to a general characteristic of this other aspect, the two inputs are respectively connected to two of the power supply nodes of the inverters via two so-called transfer capacitors, and the circuit comprises a first circuit configured to render temporarily floating the memory element during an initial phase preceding the measurement phase and during the measurement phase.

According to one embodiment, the circuit comprises a first power supply terminal and a second power supply terminal which are intended to receive respectively a first low power supply and a second high power supply, and the first circuit comprises a first set of controllable switches configured to disconnect all the power supply nodes of the inverters from the two power supply terminals.

According to one embodiment, the power supply nodes of the inverters are the sources of the NMOS transistors of these inverters and the sources of the PMOS transistors of these inverters, and the two transfer capacitors are connected respectively between the two inputs and the sources of the NMOS transistors of the two inverters.

According to one embodiment, the first set of controllable switches is configured to reconnect all the power supply nodes of the inverters to the two power supply terminals subsequent to the measurement phase.

According to one embodiment, the first set of controllable switches comprises four switches. A first switch is connected between the first power supply terminal and the source of the NMOS transistor of a first inverter. A second switch is connected between the second power supply terminal and the source of the PMOS transistor of the first inverter. A third switch is connected between the first power supply terminal and the source of the NMOS transistor of the second inverter. A fourth switch is connected between the second power supply terminal and the source of the PMOS transistor of the second inverter.

According to one embodiment, the amplifier circuit furthermore comprises a control interface intended to receive control signals configured to control the first and third switches so as to disconnect the sources of the NMOS transistors from the first power supply terminal and then to receive control signals configured to control the second and fourth switches so as to disconnect the sources of the PMOS transistors from the second power supply terminal.

According to one embodiment, the amplifier circuit furthermore comprises a second circuit configured to connect the input nodes of the inverters to the output nodes of these inverters during the initial phase and to disconnect the input nodes from the output nodes during the measurement phase.

According to one embodiment, the core furthermore comprises a capacitive network connected to all the power supply nodes of the inverters and comprising the two transfer capacitors and a third circuit configured to connect the capacitive network to the power supply terminals in the initial phase prior to the disconnection of all the power supply nodes of the inverters from the two power supply terminals.

According to one embodiment, the capacitive network comprises a number of capacitors. A first capacitor is connected between the first input and the first power supply terminal. A second capacitor is connected between the second input and the first power supply terminal. A third capacitor is connected between the first power supply terminal and the source of the PMOS transistor of the first inverter. A fourth capacitor is connected between the first power supply terminal and the source of the PMOS transistor of the second inverter. The first transfer capacitor is connected between the first input and the source of the NMOS transistor of the second inverter. The second transfer capacitor is connected between the second input and the source of the NMOS transistor of the first inverter.

The third circuit comprises the switches of the first set of switches. A fifth switch is connected between the first input and the second power supply terminal. A sixth switch is connected between the second input and the second power supply terminal.

The fifth and sixth switches are moreover advantageously intended to be open during the measurement phase.

According to another aspect, there is proposed a memory device, for example, a non-volatile memory device, that comprises a memory plane, a line decoder, a column decoder and at least one amplifier circuit such as is defined hereinabove.

BRIEF DESCRIPTION OF THE DRAWINGS

Other advantages and characteristics of the invention will become apparent on examining the wholly non-limiting detailed description of modes of implementation and embodiments, and the appended drawings in which.

DETAILED DESCRIPTION OF ILLUSTRATIVE EMBODIMENTS

Figure 1:
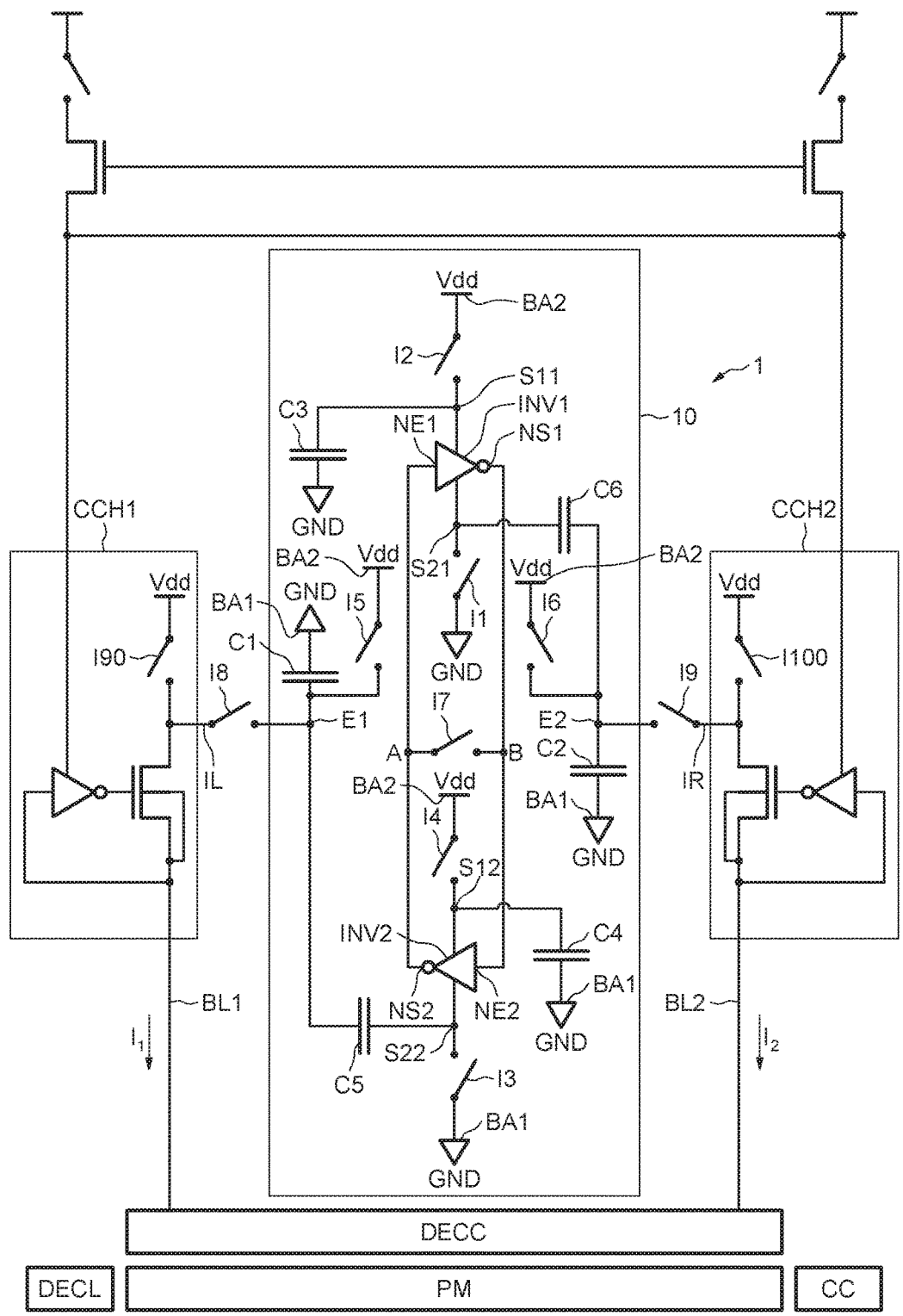
FIG. 1 and FIG. 2 schematically illustrate an embodiment of a read-amplifier circuit according to the invention, and FIGS. 3 to 7 schematically illustrate a mode of implementation of a method according to the invention.

In FIG. 1, the reference 1 designates a read-amplifier circuit, advantageously embodied in an integrated manner on silicon, having a core 10 possessing a first differential input and a second differential input E1, E2 respectively coupled to two bit lines BL1, BL2 of a memory device by way of two switches I8 and I9 and of two precharging circuits CCH1 and CCH2, of conventional structure known per se.

The precharging circuits CCH1 and CCH2 serve to precharge the bit lines BL1 and BL2 to precharge voltages prior to the reading operation properly speaking performed by the read-amplifier circuit 1. During this bit line precharging phase, the switches I90 and I100 are closed.

The memory device, for example a non-volatile memory, comprises a memory plane and in a conventional manner a column decoder DECC and a line decoder DECL.

During a reading operation, the bit lines BL1 and BL2 are selected simultaneously but a single word line is selected by way of the decoder DECL.

If it is assumed for example that the selected memory cell in which it is sought to read the stored data item is situated at the intersection of the bit line BL1 and of the corresponding word line, then the second bit line BL2 does not represent a data item but provides a capacitive charge to balance the read-amplifier circuit as well as a reference current.

Of course, in other situations, it would be entirely possible this time for it to be the bit line BL2 which is connected to the memory cell containing the data item to be read and that it is the first bit line BL1 which serves for capacitive charge and which provides a reference current.

During the bit line precharging phase, the switches I8 and I9 are open.

On the other hand, as will be seen in greater detail hereinafter, during specific phases of the reading operation performed by the amplifier circuit, namely the measurement ("sensing") phase and the latching phase, the switches I8 and I9 are closed.

Since the word line coupled to the bit line BL1 is activated whilst the word line coupled to the bit line BL2 is not activated, the currents I1 and I2 differ. As a function of which current is the higher, one of the signals IL or IR will decrease more strongly than the other.

The core 10 will then detect the difference between the slopes of the signals IL and IR arising from the bit lines and present at the inputs E1 and E2.

Figure 2:
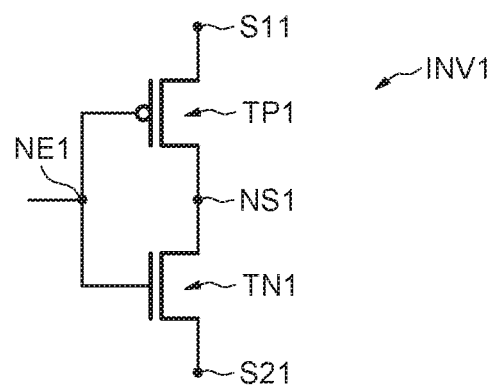
Figure 2:
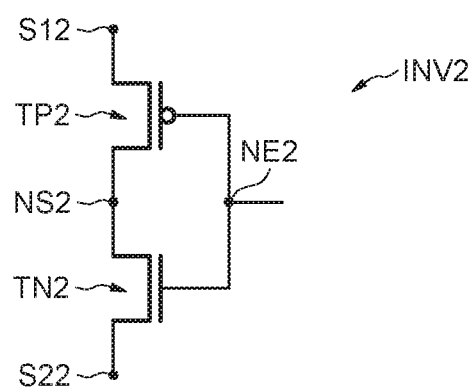

Before returning in greater detail to the manner of operation of the read-amplifier circuit 1, we shall now describe an exemplary structure thereof while referring more particularly to FIGS. 1 and 2.

The core 10 comprises a memory element formed of two inverters INV1 and INV2 coupled in a crossed manner. More particularly, the output node NS1 of the inverter INV1 is connected to the input node NE2 of the inverter INV2 and the output node NS2 of the inverter INV2 is connected to the input node NE1 of the inverter INV1.

As illustrated in FIG. 2, the inverter INV1 comprises a PMOS transistor TP1 whose source S11 forms a first power supply node of this inverter, and an NMOS transistor TN1 connected in series with the PMOS transistor TP1. The source S21 of the transistor TN1 forms another power supply node S21 for the inverter INV1.

The drains of the transistors TP1 and TN1 form the output node NS1 whilst the gates of these transistors, linked together, form the input node NE1.

The structure of the second inverter INV2 is similar to that of the inverter INV1 and comprises a PMOS transistor TP2 connected in series with an NMOS transistor TN2. The source S12 of the transistor TP2 forms a power supply node for the inverter INV2 whilst the source S22 of the transistor TN2 forms another power supply node for the inverter INV2.

The drains of the transistors TP2 and TN2 form the output node NS2 of the inverter INV2 whilst the gates, linked together, of these transistors form the input node NE2.

The core of the amplifier circuit moreover comprises a first power supply terminal BA1 and a second power supply terminal BA2.

The first power supply terminal BA1 is intended to be connected to a first low supply voltage, for example ground GND, whilst the second power supply terminal BA2 is intended to receive a second high supply voltage, for example the voltage Vdd.

The core 10 moreover comprises a first set of controllable switches configured to disconnect or connect the power supply nodes of the two inverters INV1 and INV2 for the two power supply terminals BA1, BA2.

More particularly, this first set of controllable switches comprises a number of switches. A first switch I1 is connected between the first power supply terminal BA1 and the source S21 of the NMOS transistor TM of the first inverter INV1. A second switch I2 is connected between the second power supply terminal BA2 and the source S11 of the PMOS transistor TP1 of the first inverter. A third switch I3 is connected between the first power supply terminal BA1 and the source S22 of the NMOS transistor TN2 of the second inverter. A fourth switch I4 is connected between the second power supply terminal BA2 and the source S12 of the PMOS transistor TP2 of the second inverter INV2.

The core 10 moreover comprises a second controllable circuit, in this instance a controllable switch I7, intended to connect together or to disconnect the output nodes NS1, NS2 and the input nodes NE1, NE2 of the two inverters.

The core 10 furthermore comprises a capacitive network connected (directly or indirectly) to the power supply nodes of the inverters.

More particularly, the capacitive network comprises a number of capacitors. A first capacitor C1 is connected between the first input E1 and the first power supply terminal BA1. A second capacitor C2 is connected between the second input E2 and the first power supply terminal BA1. A third capacitor C3 is connected between the first power supply terminal BA1 and the source S11 of the PMOS transistor TP1 of the first inverter INV1. A fourth capacitor C4 is connected between the first power supply terminal BA1 and the source S12 of the PMOS transistor TP2 of the second inverter INV2. A first, so-called transfer, capacitor C5 is connected between the first input E1 and the source S22 of the NMOS transistor TN2 of the second inverter. A second, so-called transfer, capacitor C6 is connected between the second input E2 and the source S21 of the NMOS transistor TN1 of the first inverter INV1.

Moreover, the core also comprises a third controllable circuit that is configured to connect this capacitive network to the power supply terminals in a first situation and to disconnect this capacitive network from the power supply terminals in another situation.

More particularly, the third controllable circuit comprises the switches I1-I4 of the first set of switches, as well as a fifth switch I5 connected between the first input E1 and the second power supply terminal BA2 and a sixth switch I6 connected between the second input E2 and the second power supply terminal BA2.

The various switches described hereinabove may be for example embodied by MOS transistors controlled on their gate. The gates of these transistors form a control interface intended to receive the various control signals making it possible to control these switches. The logic values of these control signals will define the character, enabled or disabled, of the transistors.

When the MOS transistor is enabled, the switch is considered to be closed whilst when the MOS transistor is disabled, the switch is considered to be open. The various control signals are delivered by a control circuit CC embodied for example on the basis of logic circuits.

Reference is now more particularly made to FIGS. 3 to 7 to describe a method of control of such a read-amplifier circuit during an operation of reading a data item stored in a memory device.

It is assumed at this juncture that the bit lines BL1, BL2 have been precharged.

The reading operation performed by the amplifier circuit 1 comprises firstly an initial phase in which the capacitive network C1-C6 is charged via the two power supply terminals BA1 and BA2.

Figure 3:
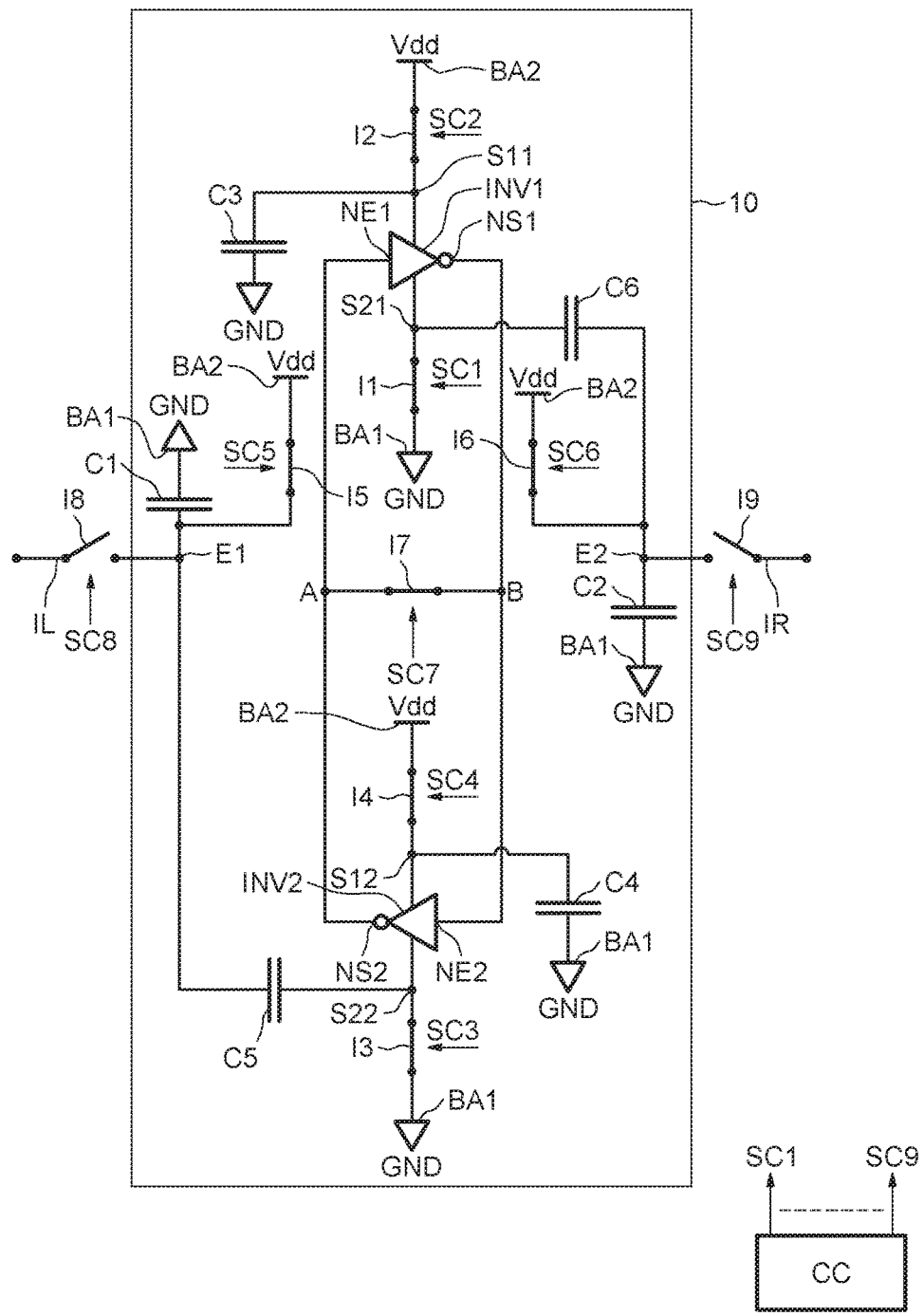

This is illustrated in FIG. 3.

More precisely, in this phase of charging the capacitive network, the switches 18 and 19 are open whilst all the other switches of the core I1-I7 are closed. Here, the transfer capacitors C5 and C6 perform a disabling of DC component.

The power supply nodes S11 and S12 are then raised to the supply voltage Vdd whilst the power supply nodes S21 and S22 are earthed to ground GND.

Moreover, since the switch I7 is closed, the voltage at the nodes A and B (corresponding to the input and output nodes of the inverters), is equalized to a value VM which is equal for example to half the amplitude of an output transition of the inverter.

After this step of charging the capacitive network, the initial phase of the reading operation will comprise a disconnection of the power supply nodes of the two inverters from the two power supply terminals BA1 and BA2.

This disconnection is performed in two steps here.

Figure 4:
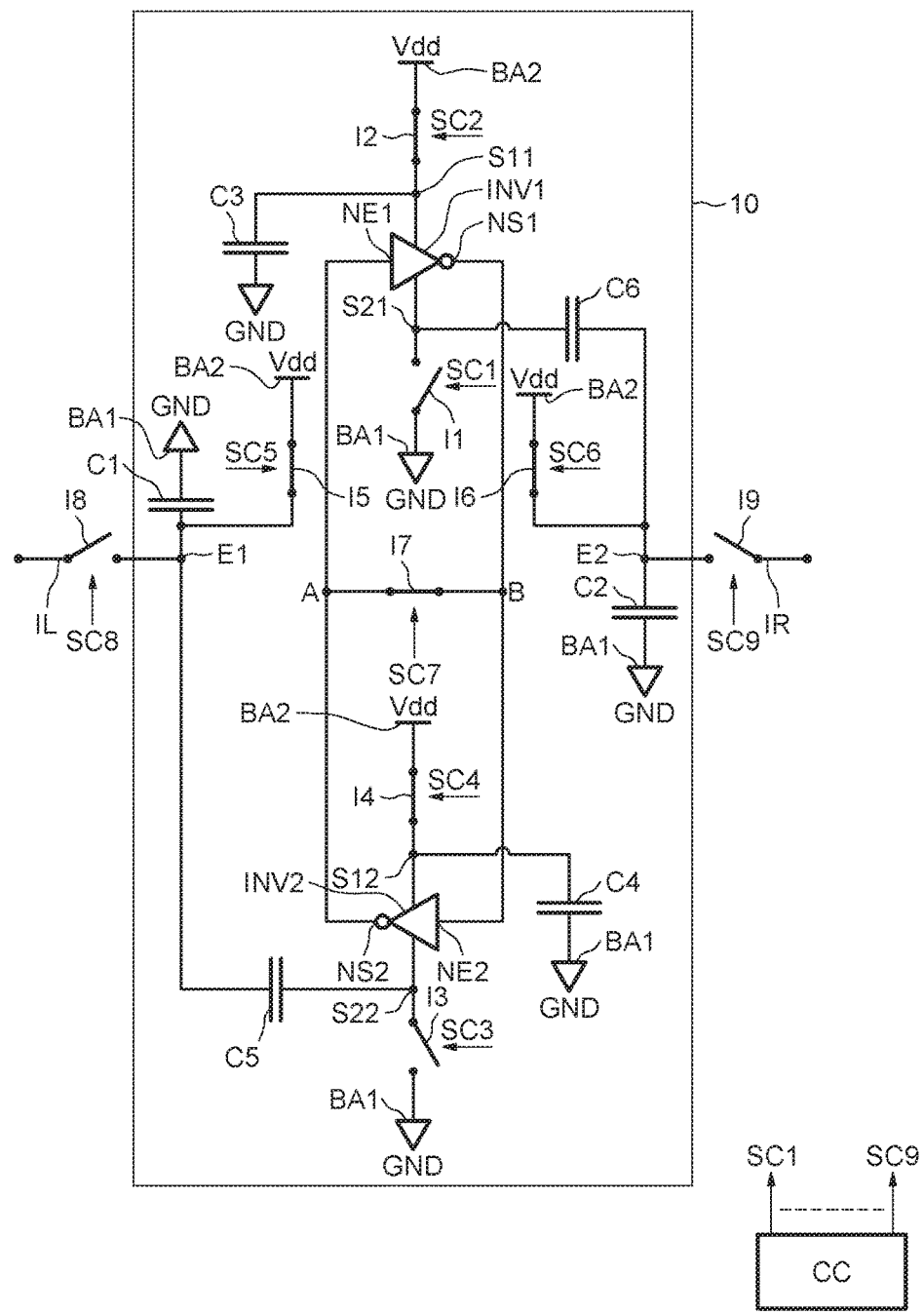

In a first step, illustrated in FIG. 4, the sources S21 and S22 of the NMOS transistors TN1 and TN2 are disconnected firstly from the first power supply terminal BA1 (ground GND) by opening the switches I1 and I3.

The switch I7 remains closed.

Consequently, the voltage at the node S21 rises from the value 0 to the value VM-VTN1 where VTN1 designates the threshold voltage of the transistor TN1.

Likewise, the voltage at the source S22 rises from the value 0 to the value VM-VTN2 where VTN2 designates the threshold voltage of the NMOS transistor TN2.

Figure 5:
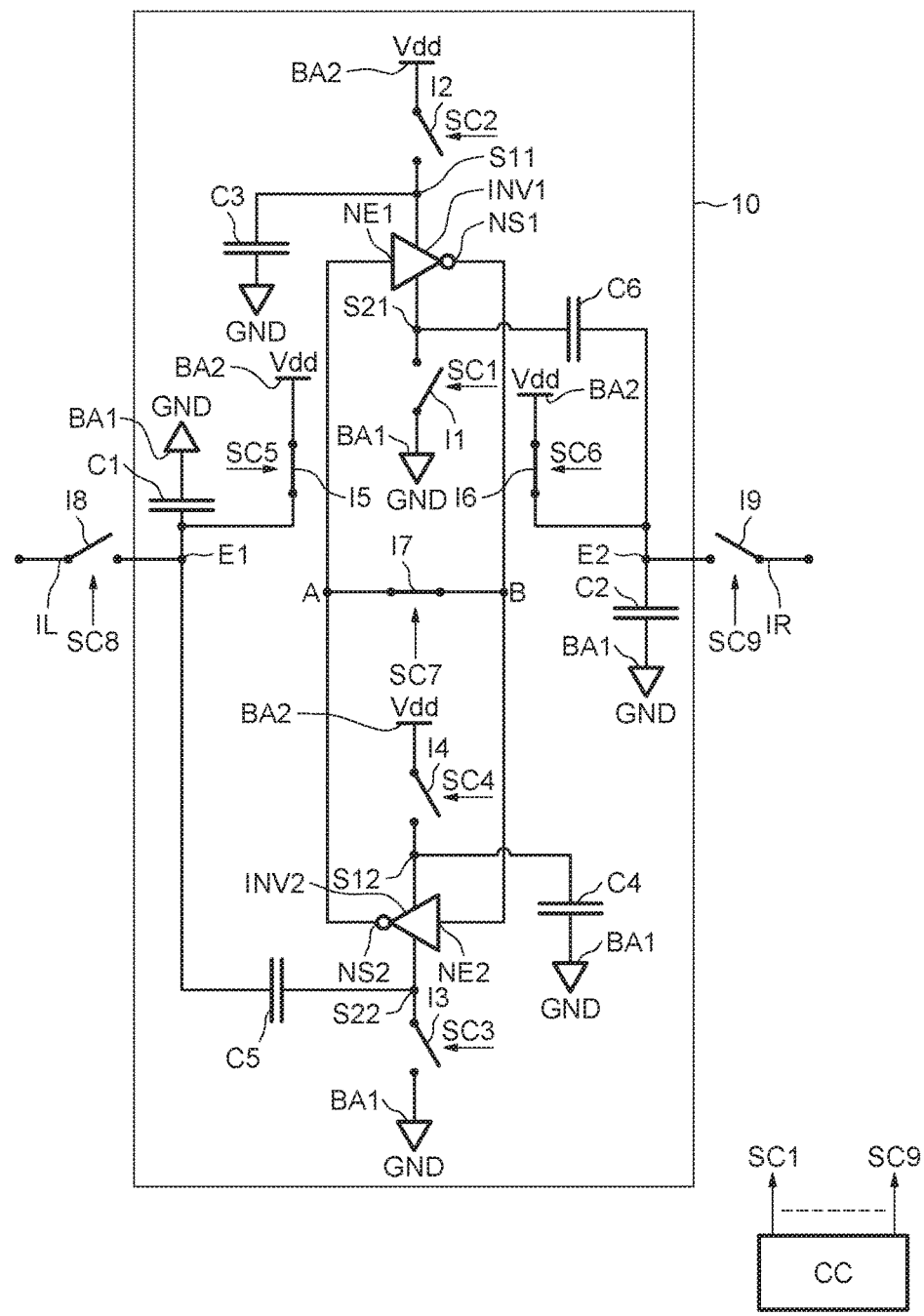

Next, in a second step, illustrated in FIG. 5, the sources S11 and S12 of the PMOS transistors TP1 and TP2 are disconnected from the second power supply terminal BA2 (the voltage Vdd), by opening the switches I2 and I4.

The switch I7 still remains closed.

At this juncture, the memory element INV1, INV2 is floating and will tend to an equilibrium state.

Indeed, the voltage at the source S11 will fall from the value Vdd to the value VM+VTP1 where VTP1 designates the threshold voltage of the PMOS transistor TP1.

Likewise, the voltage at the source S12 will fall from the value Vdd to the value VM+VTP2, where VTP2 designates the threshold voltage of the PMOS transistor TP2.

During this time, the voltages at the sources S21 and S22 continue to rise and, at a given instant, all the transistors TP1, TP2, TN1 and TN2 of the two inverters will be disabled (OFF).

The equilibrium state has then been attained with automatic compensation of the voltage offset.

Figure 6:
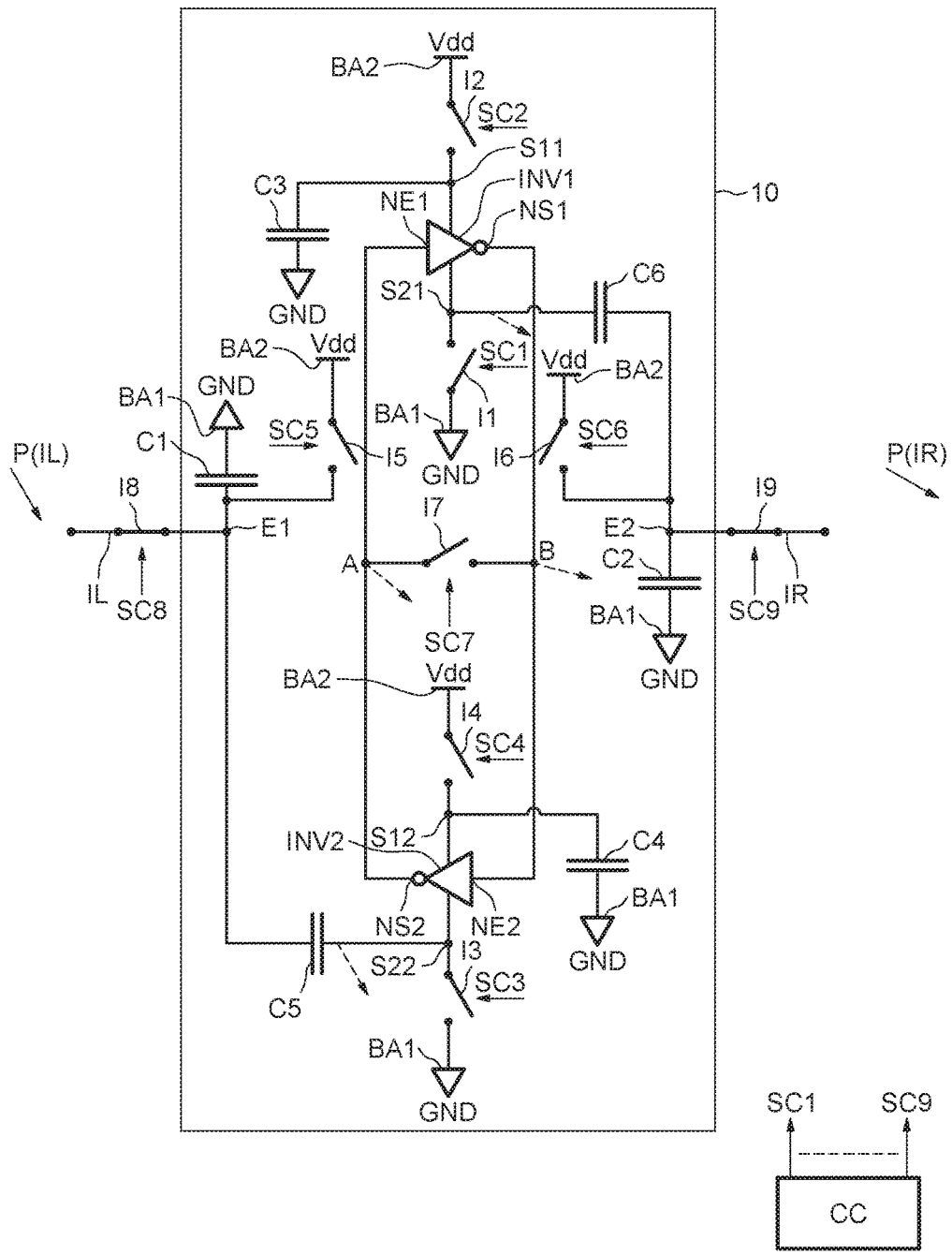

Reference is now more particularly made to FIG. 6 to illustrate the phase of measurement ("sensing") of the amplifier circuit which follows the initial phase.

In this measurement phase, the switches I8 and I9 are closed, thereby making it possible to link the inputs E1 and E2 to the two bit lines BL1 and BL2. The voltages IL and IR at these two inputs E1 and E2 will drop at two different speeds and the amplifier circuit will measure the difference between the slopes P(IL) and P(IR) of the signals IL and IR. The capacitors C1 and C2 make it possible to avoid having overly steep slopes.

In this measurement phase, the memory element INV1, INV2 is kept floating (switches I1, I2, I3 and I4 open).

Moreover, the switches I5 and I6 are open as is the switch I7. The opening of the switch I7 breaks the equilibrium state which had been attained on completion of the initial phase.

The signal originating from the bit line BL1 is transferred to the node S22 by way of the transfer capacitor C5.

Likewise, the signal originating from the bit line BL2 is transferred to the node S21 by way of the transfer capacitor C6. It is assumed in this example that the voltage at the input E1 drops more rapidly than the voltage at the input E2 (the slope P(IL) is bigger than P(IR)).

Under these conditions, the voltage at the node S22 will drop more rapidly than the voltage at the node S21.

The voltages at the nodes S11 and S12 remain substantially constant.

Therefore, the NMOS transistor TN2 of the second inverter INV2 will become enabled more rapidly than the NMOS transistor TN1 of the first inverter INV1.

Consequently, the voltage at the node A will drop more quickly than the voltage at the node B.

The energy necessary for the toggling of the memory element, which is still not powered in this measurement phase, is provided by the capacitors C3 and C4.

Figure 7:
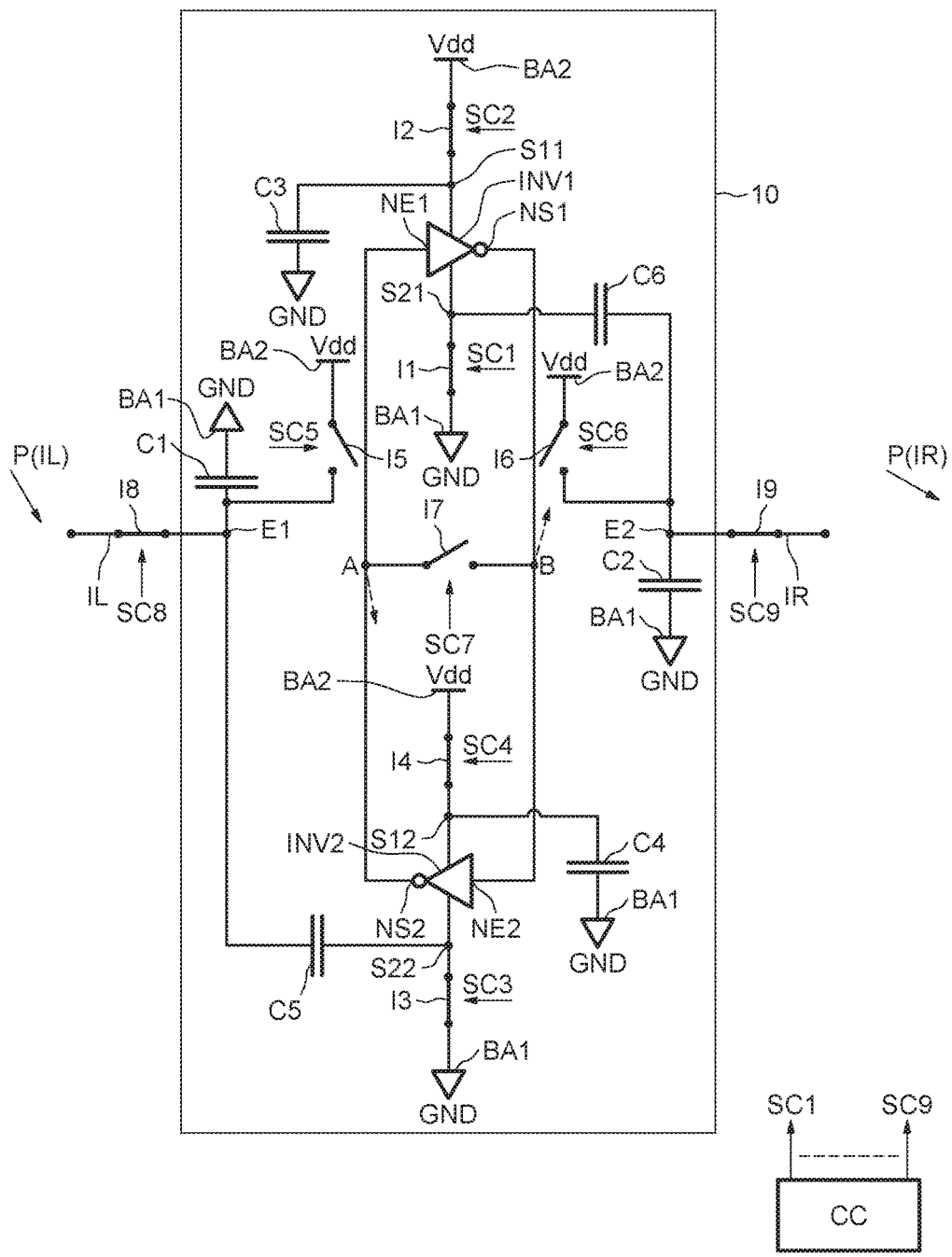

This measurement phase is left to run for a certain time, typically from 1 to 2 nanoseconds before proceeding to the step of latching the data item read illustrated in FIG. 7.

In this latching phase, the power supply nodes of the two inverters INV1 and INV2 are reconnected to the two power supply terminals by closing the switches I1 to I4.

The memory element then being powered "violently," it confirms the result of the measurement operation performed in the measurement phase, that is to say an accentuated drop of the voltage at the node A and an increase in the voltage at the node B so as to attain the full CMOS levels corresponding respectively to the logic values 0 and 1.

The logic value of the stored data item can then be read either on the basis of the output node NS1 or on the basis of the output node NS2.

The amplifier circuit which has just been described thus makes it possible to minimize dynamic consumption by working at low supply voltage Vdd, typically 0.8 volts. The immunity to noise is increased since the memory element is not powered during the measurement phase. The measurement precision is consequently increased. The sensitivity to the mismatching of the active elements (MOS transistors) is reduced. For their part, the capacitors exhibit by nature characteristics which are much better matched.

Finally, transistors of small size will advantageously be chosen thereby making it possible to increase the speed while decreasing the consumption of current and the space required on silicon.

What is claimed is:

1. A method of operating a sense amplifier, the method comprising:
  pre-charging a first and second bit lines of a memory device with respective first and second pre-charging circuits during a pre-charge phase, wherein the first pre-charging circuit is coupled to a first input terminal of the sense amplifier via a first switch and the second pre-charging circuit is coupled to a second input terminal of the sense amplifier via a second switch;
  charging a capacitive network of the sense amplifier during an initial phase, wherein the capacitive network comprises
    a first capacitor coupled between the first input terminal and a first supply node of a second logic gate of a latch, the first supply node of the second logic gate coupled to a first power supply terminal via a third switch, and a second capacitor coupled the second input terminal and a first supply node of a first logic gate of the latch, the first supply node of the first logic gate coupled to the first power supply terminal via a fourth switch, the second logic gate of the latch having an output coupled to an input of the first logic gate of the latch, and an input coupled to an output of the first logic gate of the latch;

raising respective voltages of the first supply nodes of the first and second logic gates by opening the third and fourth switches after charging the capacitive network and during the initial phase;

sensing, during a sensing phase and after the initial phase, a difference between slopes of signals present at the first and second input terminals by closing the first and second switches; and latching, during a latching phase and after the sensing phase, data in the first and second logic gates by closing the third and fourth switches.

2. The method of claim 1, wherein the sensing phase lasts less than 2 ns.

3. The method of claim 1, wherein pre-charging the first and second bit lines comprises opening the first switch and opening the second switch.

4. The method of claim 1, wherein the first logic gate comprises a first inverter and the second logic gate comprises a second inverter.

5. The method of claim 1, wherein the capacitive network further comprises a third capacitor coupled between a second supply node of the second logic gate and a second power supply terminal via a fifth switch, and a fourth capacitor coupled between a second supply node of the first logic gate and the second power supply terminal via a sixth switch, the method further comprising lowering respective voltages of the second supply nodes of the first and second logic gates by opening, during the initial phase, the fifth and sixth switches after opening the third and fourth switches.

6. The method of claim 5, further comprising, disabling all transistors of the first and second logic gates during the initial phase and after opening the fifth and sixth switches.

7. The method of claim 5, further comprising:
connecting the first power supply terminal to ground; and
connecting the second power supply terminal to a positive voltage node.

8. The method of claim 1, wherein charging the capacitive network comprises opening the first and second switches and closing the third and fourth switches.

9. The method of claim 1, further comprising:
equalizing a voltage of the output of the first logic gate with a voltage of the second logic gate during the initial phase by closing a seventh switch.

10. The method of claim 9, wherein sensing the difference between slopes further comprises opening the seventh switch during the sensing phase.

11. A sense amplifier comprising:
a first supply terminal;
a second supply terminal;
a first inverter having
an input,
an output,
a first supply node coupled to the first supply terminal via a first switch, and
a second supply node coupled to the second supply terminal via a second switch;

a second inverter having
an input coupled to the output of the first inverter,
an output coupled to the input of the first inverter,
a first supply node coupled to the first supply terminal via a third switch, and
a second supply node coupled to the second supply terminal via a fourth switch;
a fifth switch coupled between the input of the first inverter and the output of the first inverter;
a first input terminal coupled to the second supply node of the second inverter via a first capacitor;
a second input terminal coupled to the second supply node of the second inverter via a second capacitor;
a first output terminal coupled to the output of the first inverter; and
a second output terminal coupled to the output of the second inverter.

12. The sense amplifier of claim 11, wherein the second supply terminal is coupled to ground and the first supply terminal receives a voltage higher than ground.

13. The sense amplifier of claim 11, wherein
the first inverter comprises a PMOS transistor having a source connected to the first supply node of the first inverter and an NMOS transistor having a source connected to the second supply node of the first inverter; and
the second inverter comprises a PMOS transistor having a source connected to the first supply node of the second inverter and an NMOS transistor having a source connected to the second supply node of the second inverter.

14. The sense amplifier of claim 11, further comprising:
a third capacitor coupled between the first input terminal and the second supply terminal;
a fourth capacitor coupled between the second input terminal and the second supply terminal;
a sixth switch coupled between the first input terminal and the first supply terminal; and
a seventh switch coupled between the second input terminal and the first supply terminal.

15. The sense amplifier of claim 11, wherein:
the first input terminal is configured to be coupled to a first pre-charge circuit via an eighth switch; and
the second input terminal is configured to be coupled to a second pre-charge circuit via a ninth switch.

16. The sense amplifier of claim 15, wherein:
the first pre-charge circuit comprises a transistor coupled to a first bit line of a memory device; and
the second pre-charge circuit comprises a transistor coupled to a second bit line of the memory device.

17. The sense amplifier of claim 11, wherein the first and second inverters are configured to produce respective first and second output signal in respective first and second output terminals based on a difference between slopes of signals present at the first and second input terminals during a measurement phase.

18. The sense amplifier of claim 17, wherein the first, second, third and fourth switch are configured to be open during an initial phase preceding the measurement phase.

19. The sense amplifier of claim 18, wherein the first and second output signals are equalized to a first voltage during the initial phase.

20. A memory device comprising:
a first and second bit lines;
a pre-charging circuit configured to pre-charge the first and second bit lines during a pre-charge phase; and a sense amplifier comprising a first and second input terminals coupled to the first and second bit lines, a latch, and a capacitive network coupled to a first and second power supply nodes of the latch, the sense amplifier configured to charge the capacitive network by connecting the capacitive network to a first and second power supply terminals, float the latch by disconnecting the first and second power supply terminals from the capacitive network after charging the capacitive network, sense a difference between slopes of signals present at the first and second input terminals while the latch is floating, and latching data in the latch based on the difference between slopes by connecting the first and second power supply terminals to the capacitive network.

21. The memory device of claim 20, wherein the latch comprises a first inverter having a first input and an output, and a second inverter having an input coupled to the output of the first inverter and an output coupled to the input of the first inverter.

* * * * *